United States Patent
Storey et al.

(10) Patent No.: US 10,267,845 B2
(45) Date of Patent: Apr. 23, 2019

(54) WAFER LEVEL BURN-IN SYSTEM

(71) Applicant: Delta V Instruments, Inc., Richardson, TX (US)

(72) Inventors: Robert W. Storey, Highland Village, TX (US); William Robert Caldwell, Rowlett, TX (US); Clint D. Wilson, Allen, TX (US); Glenn Lee Prince, Murphy, TX (US); Stephen Kyle Collins, Plano, TX (US); Michael S. Walker, Dallas, TX (US); Kerry F. Cage, Carrollton, TX (US)

(73) Assignee: Delta V Instruments, Inc., Richardson, TX (US)

(*) Notice: Subject to any disclaimer, the term of this patent is extended or adjusted under 35 U.S.C. 154(b) by 0 days.

(21) Appl. No.: 15/593,601

(22) Filed: May 12, 2017

(65) Prior Publication Data

US 2018/0328978 A1    Nov. 15, 2018

(51) Int. Cl.
*G01R 31/26* (2014.01)
*H01L 21/66* (2006.01)
*G01R 31/28* (2006.01)

(52) U.S. Cl.
CPC ..... *G01R 31/2642* (2013.01); *G01R 31/2875* (2013.01); *H01L 22/14* (2013.01)

(58) Field of Classification Search
None
See application file for complete search history.

(56) References Cited

U.S. PATENT DOCUMENTS

| | | | | |
|---|---|---|---|---|
| 4,690,021 | A * | 9/1987 | Clark | B21D 28/12 271/223 |
| 6,518,068 | B1 * | 2/2003 | Gambini | G01N 21/15 250/361 C |
| 7,202,684 | B2 * | 4/2007 | Fenk | G01R 31/2862 165/80.3 |
| 9,304,160 | B1 * | 4/2016 | Jensen | G01R 31/2601 |
| 2005/0162176 | A1 * | 7/2005 | Bucksch | G01R 31/31924 324/754.18 |
| 2007/0013385 | A1 * | 1/2007 | Taylor | G01R 31/2891 324/537 |

(Continued)

OTHER PUBLICATIONS

Wikipedia, Wafer Testing, Feb. 20, 2017.
Wikipedia, Fiducial Marker, Feb. 16, 2017.

*Primary Examiner* — Melissa J Koval
*Assistant Examiner* — Nasima Monsur
(74) *Attorney, Agent, or Firm* — Ross Barnes LLP; Monty L. Ross

(57) ABSTRACT

A system for simultaneously burning in, testing and curing all the die on an uncut semiconductor wafer having top and bottom surfaces, the system having upper and lower platen assemblies with a flow section configured to receive and discharge a temperature-controlled, circulated liquid heat transfer medium to maintain the temperatures of the top and bottom surfaces of the uncut semiconductor wafer within desired limits during wafer burn-in and testing and a programmable CPU and service controller configurable to selectively energize, monitor, test, display and store a plurality of performance parameters for the electronic circuitry of each of the plurality of die of the uncut semiconductor wafer simultaneously throughout a desired burn-in and test period.

5 Claims, 16 Drawing Sheets

(56) References Cited

U.S. PATENT DOCUMENTS

| | | | |
|---|---|---|---|
| 2010/0244866 A1* | 9/2010 | Lindsey | G01R 31/2887 324/762.03 |
| 2011/0157352 A1* | 6/2011 | Liu | G03F 9/00 348/87 |
| 2015/0226611 A1* | 8/2015 | Busche | H01L 21/6833 374/121 |

* cited by examiner

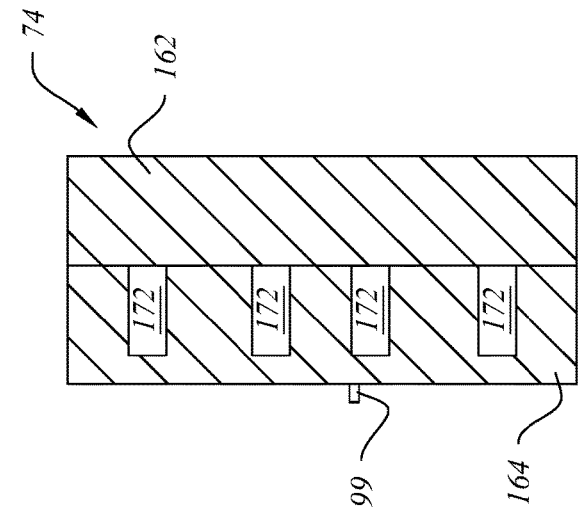
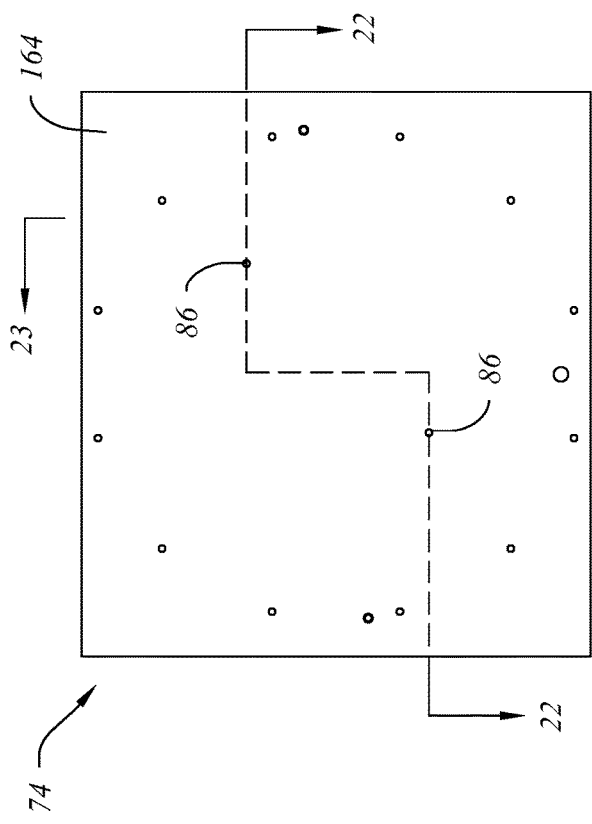
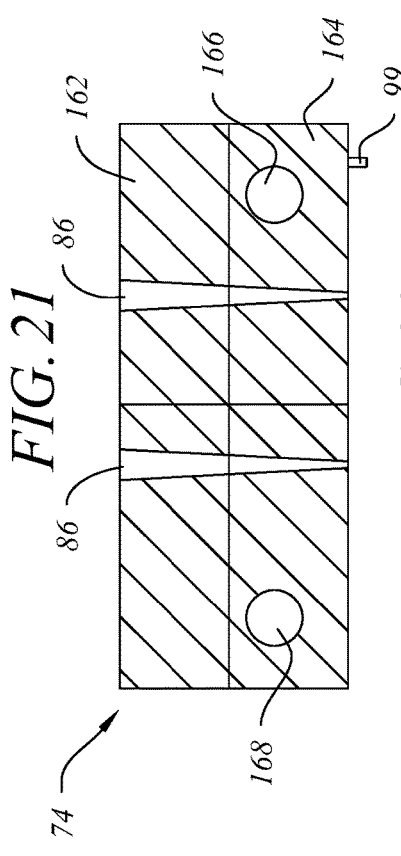

WAFER LEVEL BURN-IN SYSTEM

FIELD OF THE INVENTION

This invention relates to a device for burning in, testing and curing electronic circuitry that is embodied on small segments, or die, of a semiconductor wafer prior to cutting or dicing the wafers. One aspect of the invention relates to a system, apparatus and method that are capable of simultaneously monitoring and recording test parameters for each of more than 2000 die while also comparing the real-time values to predetermined parametric limits. Another aspect of the invention relates to a die burn-in and test method whereby test data is monitored, displayed and stored at predetermined intervals, and is subsequently recalled, processed, formatted and reported to demonstrate quantitatively the performance and functionality of each die in relation to the predetermined parameters. Another aspect of the invention relates to an apparatus and method of use whereby uncut die on a semiconductor wafer that is determined to be functioning outside predetermined parametric limits during testing can be shut down while testing continues on the other die. Another aspect of the invention is a wafer burn-in and testing apparatus that controls the top and bottom surface temperatures of the wafer within predetermined limits by circulating a temperature-controlled heat transfer liquid through platens disposed above and below the wafer. Still another aspect of the invention is a wafer burn-in and testing apparatus comprising a wafer support pad having wafer positioners that are used in cooperation with teleconcentric lenses and fiducials on the wafer to facilitate fine positional movements of the wafer in the Phi (tilt) and Theta (rotation) directions prior to compressing them against the pins of the pin chuck to commence testing. Another aspect of the invention is a recipe-based software interface that enables a user to modify the test period, testing intervals, test parameters and parametric limits using conventional spreadsheet software.

DESCRIPTION OF RELATED ART

In the context of integrated circuits, a singular "die" is typically understood to be a small block of semiconducting material upon which a functional circuit is fabricated. The integrated circuits are often produced in large batches on a single wafer of electronic-grade silicon or other semiconductor, such as gallium arsenide (GaAs), through a variety of processes that are often proprietary to the manufacturer.

The use of pins or wafer chucks in testing the integrity and performance of individual die on a semiconductor wafer (sometimes called "wafer testing") prior to cutting the wafer into a plurality of die is previously known. With one such prior art device and testing method, a probe card is held in place while a wafer, vacuum-mounted on a wafer chuck, is moved into electrical contact with the probe card. When a die (or an array of die) has been electrically tested, the prober moves the wafer to the next die (or array) and the next test can start. The wafer prober is usually responsive for loading and unloading the wafers from their carrier (or cassette) and is equipped with automatic pattern recognition optics capable of aligining the wafer with sufficient accuracy to ensure accurate registration between the contact pads on the wafer and the tips of the probes. [Wikipedia, "Wafer Testing," Feb. 20, 2017]

SUMMARY OF THE INVENTION

A semiconductor wafer burn-in system is disclosed in which each individual die disposed on an uncut semiconductor wafer is energized, tested and cured simultaneously, with test data being displayed in real time and saved in digital storage. As used in this document, "die" sometimes refers to a singular die and sometimes refers to a plurality of singular die. To initiate burn-in, testing and curing, the subject wafer is disposed on a support pad that is elevated into contact with a pin chuck supported beneath an interposer. The interposer provides electrical connectivity and comprises a plurality of removable cards further comprising current amplifiers that are fanned out in one-to-one correspondence with each of the die on the wafer. Desirably, the subject system comprises a central processing unit ("CPU") that is easily programmable using a "recipe tester" feature that enables a user to vary the test period, test intervals and acceptable ranges for identified test parameters using spreadsheet software such as Microsoft Excel®.

Two spaced-apart cameras with teleconcentric lenses are desirably aimed downwardly through bores or orifices in the top platen and pin chuck to assure that fiducials marked on the top surface of the wafer are properly aligned prior to compression of the wafer against the pins. Fine adjustments between the wafer and pin chuck in the Phi (tilt) and Theta (rotational) degrees of freedom are made using sensors in combination with positioners disposed in a wafer support pad underlying the wafer between the wafer and bottom platen.

During testing, colored indicators are desirably provided to facilitate rapid assessment of whether a particular die is performing at satisfactory, marginal or substandard levels. Testing desirably continues for a desired test period and the defined parameters can be monitored continuously or at predetermined periodic intervals that may also change (typically lengthen) during the test period. As an example, for a test period ranging from about 10 hours up to about 40 hours, test data may be recorded at one-minute intervals for the first hour, then at 5 minute intervals between hours one and 20, and at 10 minute intervals between hours 20 and 40. Any die performing outside an acceptable range for a predetermined set of test parameters can be shut down while testing continues on the other die, thereby preserving forensic evidence of faults and for avoiding possible damage to surrounding die. At the conclusion of testing, the stored data is desirably processed and configured to generate reports in such textual or graphical formats as may be desired. Depending upon the components, structure and intended use of the die that are undergoing testing, the test period, test parameters and parametric limits can vary.

The wafer temperature is desirably controlled during testing and curing, and separate temperature control loops can be provided to control the temperatures of the upper and lower platens, respectively, within a desired temperature range. According to one embodiment of the invention, the top temperature of the wafer is controlled through the upper platen by circulating filtered factory water through the upper platen at line pressure and through a heat exchanger. The temperature and flow rate are controlled by mixing valves that adjust the relative flow rates of various fluid streams each having different temperatures. The temperature of the lower platen is satisfactorily controlled using heat exchangers and a heat exchange fluid that is recirculated through the lower platen by a pump at flow rates controlled by a mixing valve and the use of a surge tank. During startup of the system, some initial heating of the lower platen may be desirable in view of the relatively greater mass of the lower platen relative to the wafer. Without such preheating, and depending to some extent upon ambient temperatures, the lower platen can function as a heat sink and cause the uncut wafer temperature to drop to an undesirably low level for testing and curing. If needed, an inline heater can be used initially to warm a heat exchange fluid that is recirculated through the lower platen. As the lower platen heats up during testing and curing of the uncut wafer, the inline heater can be turned off. Also, some of the excess heat generated during testing and curing is dissipated through use of forced air cooling in plenum sections disposed above and below the interposer.

Other benefits and advantages of the system, apparatus and method disclosed in the accompanying detailed description when read in conjunction with the accompanying drawings.

BRIEF DESCRIPTION OF THE DRAWINGS

The apparatus of the invention is further described and explained in relation to the following drawings wherein:

FIG. 21 is a bottom plan view of the upper platen assembly;

FIG. 22 is a cross-sectional view taken along line 22-22 of FIG. 21;

FIG. 23 is a cross-sectional view taken along line 23-23 of FIG. 21;

DESCRIPTION OF THE PREFERRED EMBODIMENTS

Figure 1:
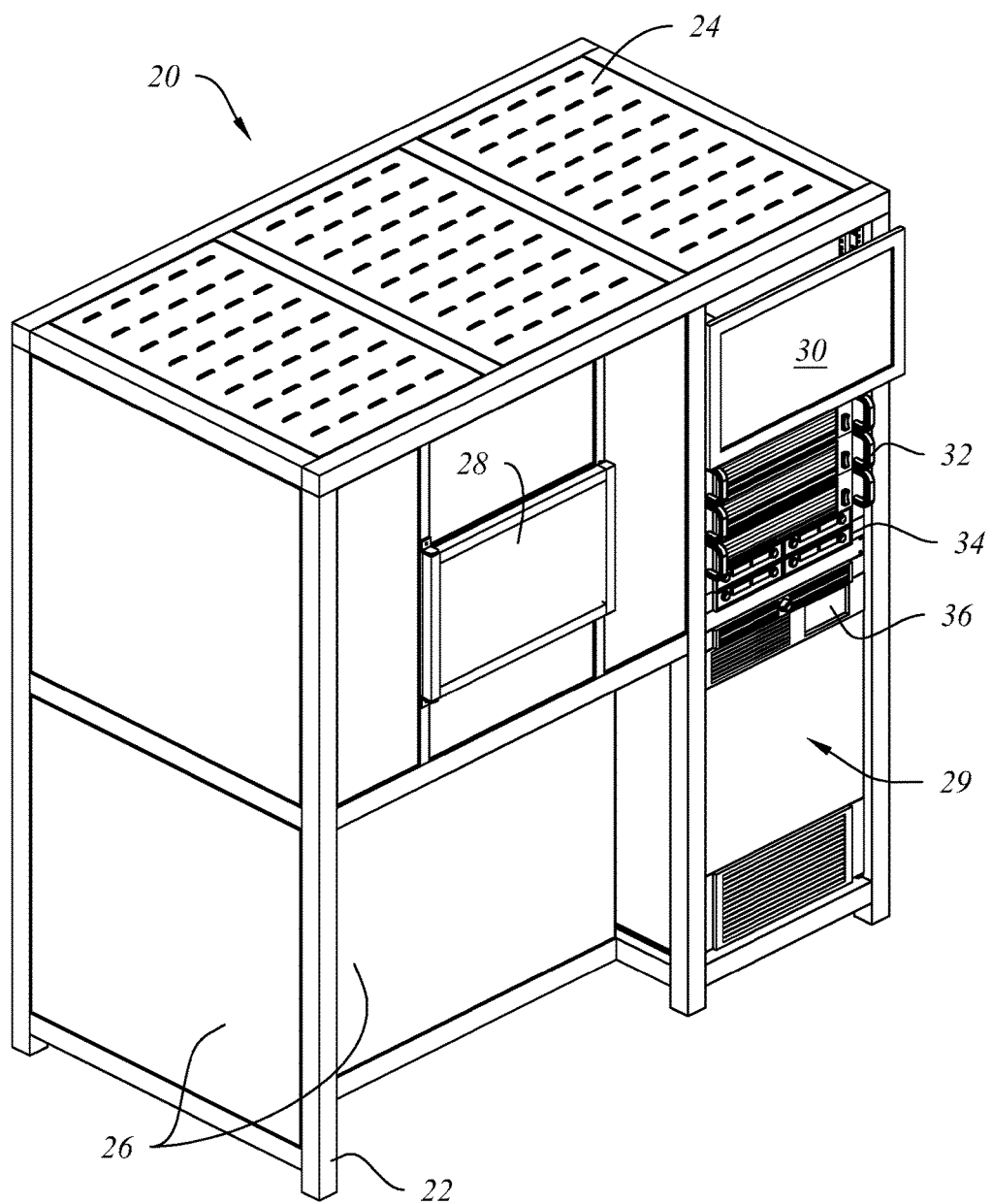
FIG. 1 is a top left perspective view of a cabinet containing an embodiment of the system and apparatus of the invention.

FIG. 1 discloses one satisfactory embodiment of the apparatus of the invention but for illustrative purposes does not include or show cables, wiring, fittings, connections, flow lines, sensors, transducers, meters or instrumentation for utilities, heaters, chillers, pumps, data transfer, or the like. Referring to FIG. 1, housing 20 comprises frame 22, a plurality of ventilated top panels 24, side panels 26, access door 28, and equipment bay 29. Equipment bay 29 desirably further comprises an electronic equipment rack (not visible) and various ancillary components including without limitation monitor 30, power supplies 32, 34, and back-up power supply 36, and the like. Referring to FIGS. 2-6, wafer burn-in and testing unit 40, which is disposed in a "burn-in bay" inside the proximal portion of housing 20 (FIG. 1), further comprises structural support members 42, upper plenum assembly 44, lower plenum assembly 45, inlet fans 46, outlet fans 48, bottom plate 50, upper plate 52, stop members 54, wafer positioning assemblies 55, screw jacks 56, anchor plates 58, support bearing 60, camera assemblies 62, 64, elevator plate 66, lower platen assembly 68, upper and lower mounting flanges 70, 72, upper platen assembly 74, elevator drive assembly 75, interposer assembly 76, pin chuck 78, and wafer support pad 80.

Figure 5:
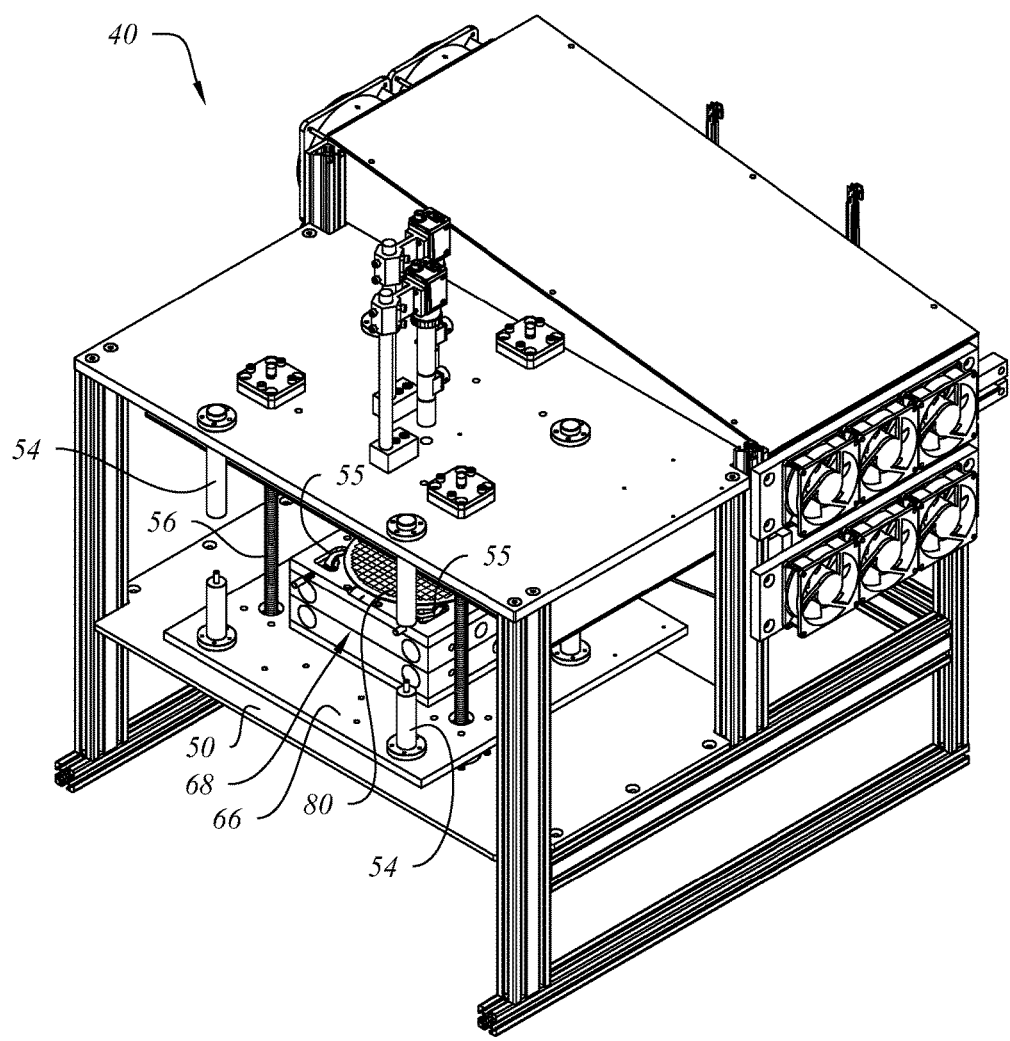
FIG. 5 is a view as in FIG. 2 with the lower platen disposed in a lowered position that exposes the wafer support surface.
Figure 6:
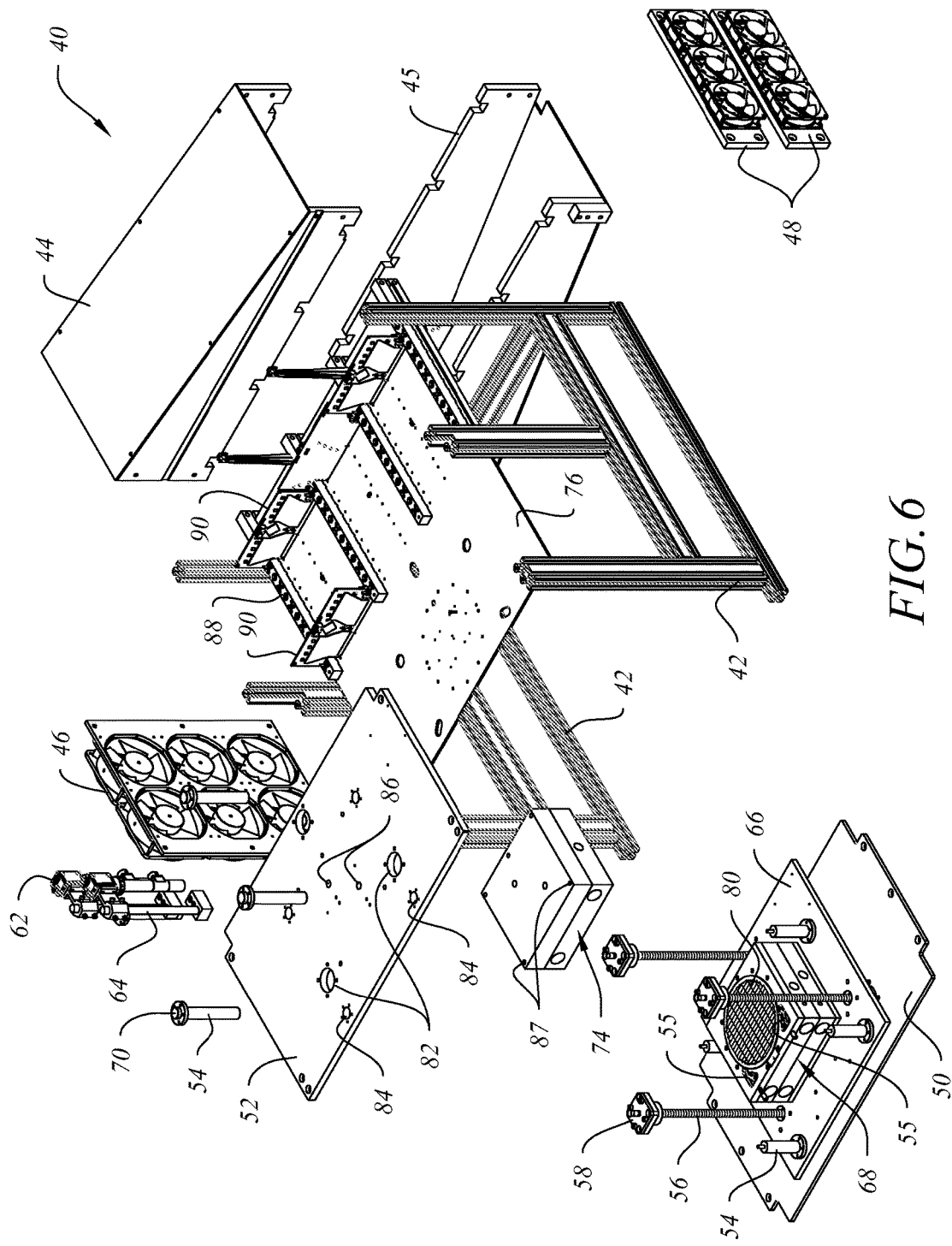
FIG. 6 is an exploded view of the apparatus of FIG. 5.
Figure 7:
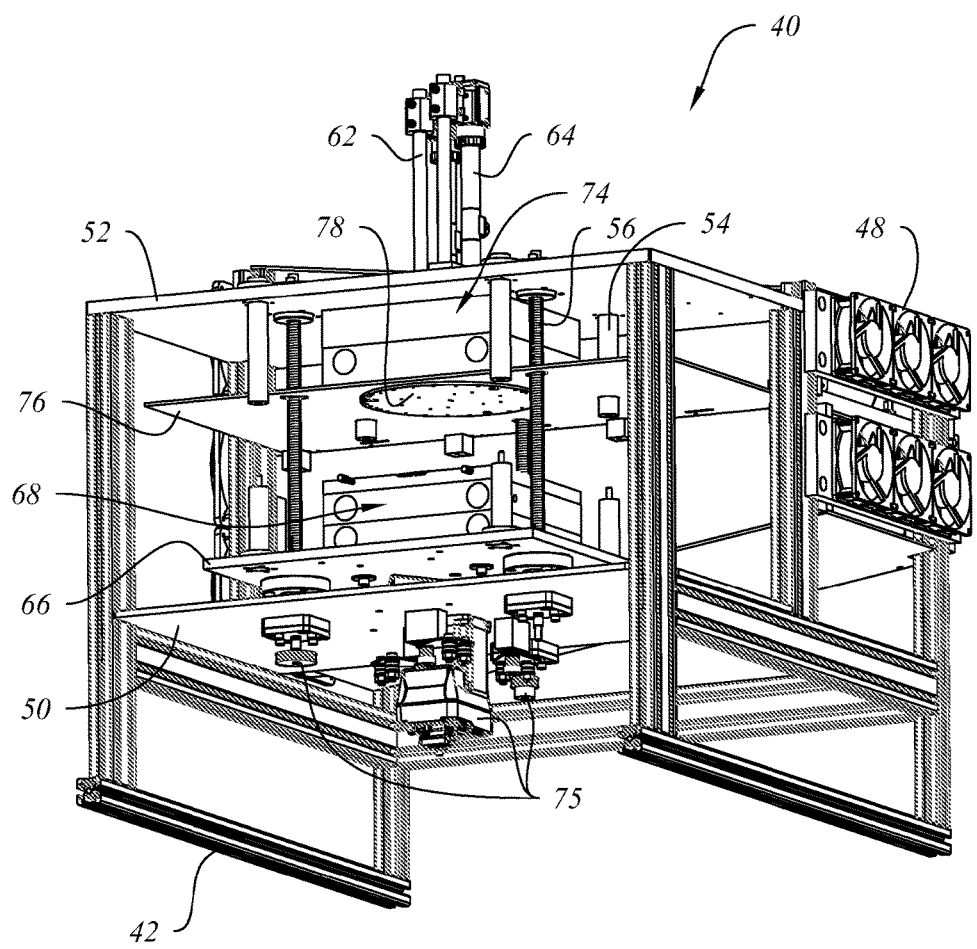
FIG. 7 is a lower front perspective view of the apparatus of FIG. 5 showing the pin chuck installed on the underside of the interposer and facing the lower platen.
Figure 17:
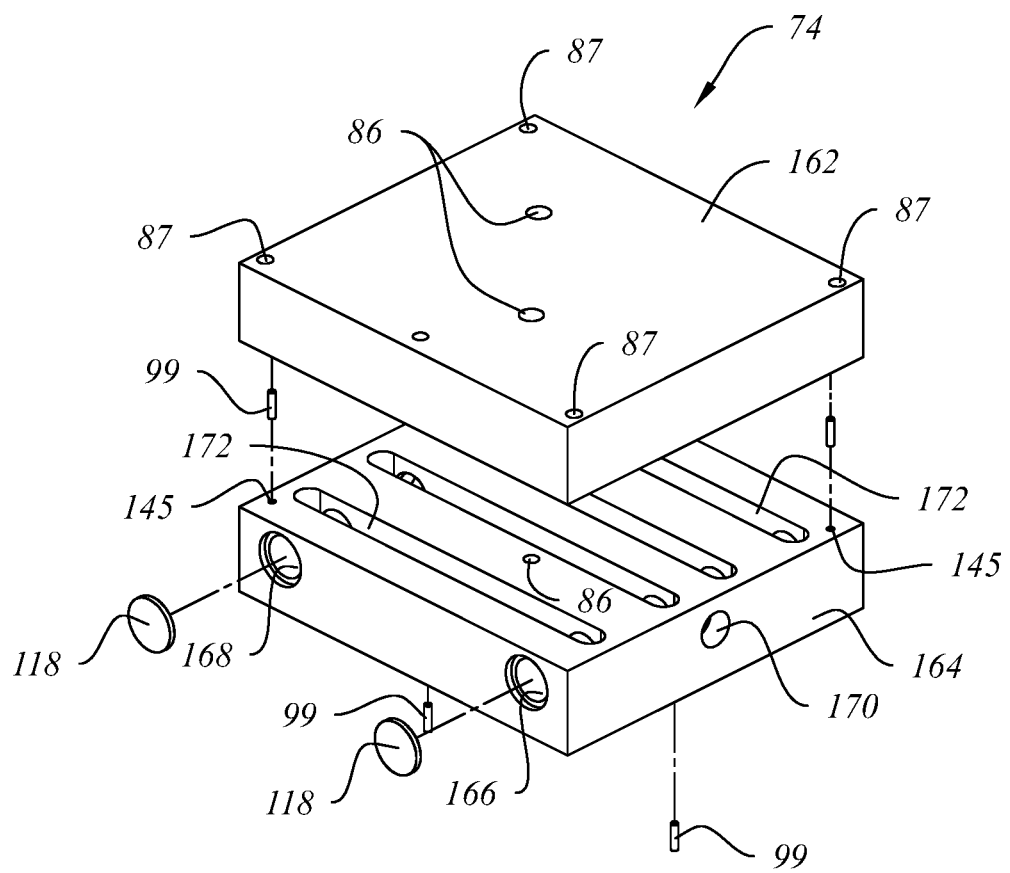
FIG. 17 is an exploded top perspective view of the upper platen assembly of FIG. 6.
Figure 18:
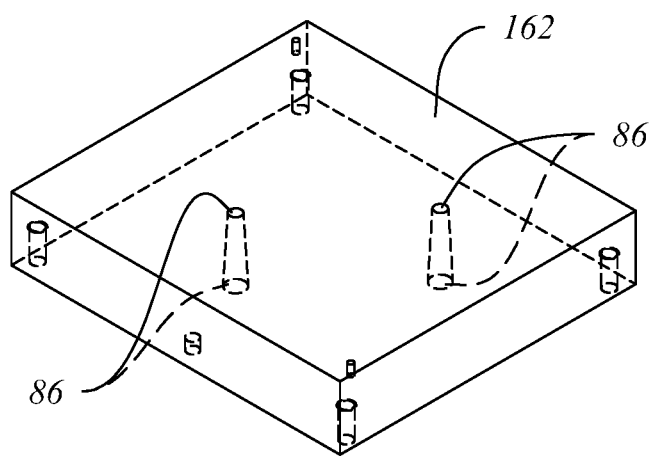
FIG. 18 is a bottom perspective view of the top plate, upper platen assembly, showing the configuration of the positioning bores in hidden outline.
Figure 19:
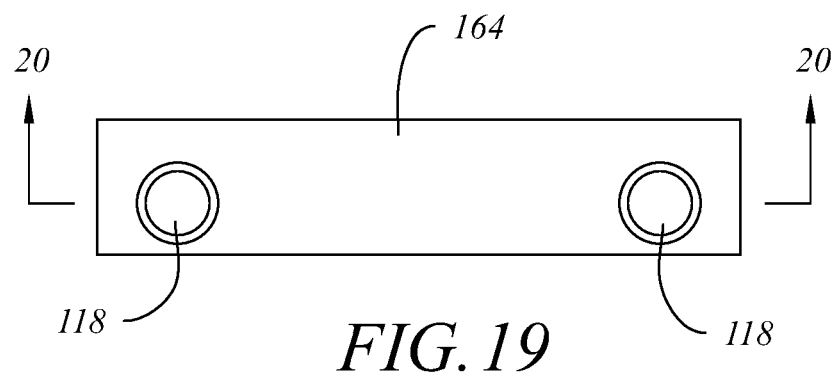
FIG. 19 is a front elevation view of the bottom plate, upper platen assembly.
Figure 20:
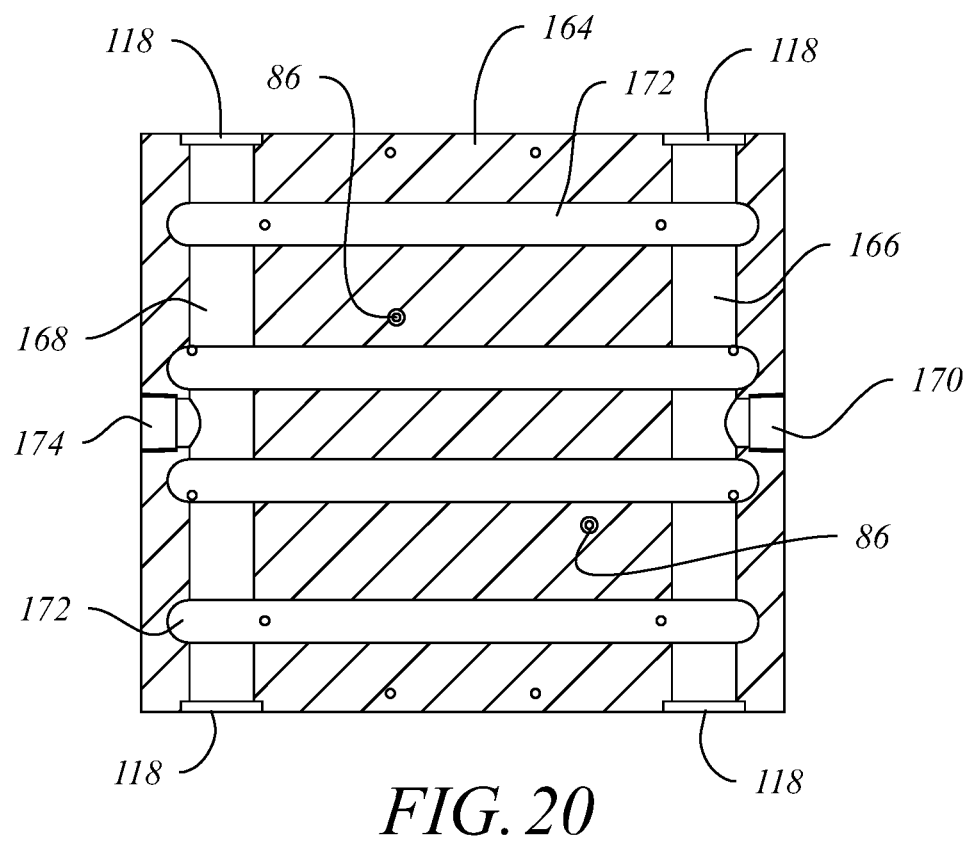
FIG. 20 is a cross-sectional view taken along line 20-20 of FIG. 19.

Referring to FIGS. 5-7, upper platen assembly 74 is desirably attached to the underside of upper plate 52, which is bolted to structural support members 42 and remains stationary during use of the invention. Upper platen assembly 74 is attached to the underside of upper plate 52 using Helicoil® inserts or equivalents in bores 87 (FIG. 6 and better seen in FIG. 17). Upper platen assembly 74 further supports the proximal end of interposer assembly 76, and pin chuck 78 is attached to the underside of interposer assembly 76. Upper platen assembly 74 and lower platen assembly 68 are useful for helping maintain the upper and lower surfaces of wafer 80 (FIG. 6) within a desired temperature range during burn-in and testing, as further described below. The average wafer temperature is satisfactorily determined by sensing and measuring the temperature at six different points around wafer, and those temperatures are periodically averaged and statistically evaluated to determine the "thin mean" of wafer 80. The thin mean of wafer 80 is typically maintained at a level close to 100° C. during burn-in and testing, although it will be appreciated that the desired temperature can vary in accordance with the structure, functional components and intended use of the uncut die on wafer 80. As discussed in greater detail below, temperature-controlled liquids are desirably circulated through upper and lower platen assemblies 74, 68 as needed to maintain the wafer temperature within a desired range.

Figure 2:
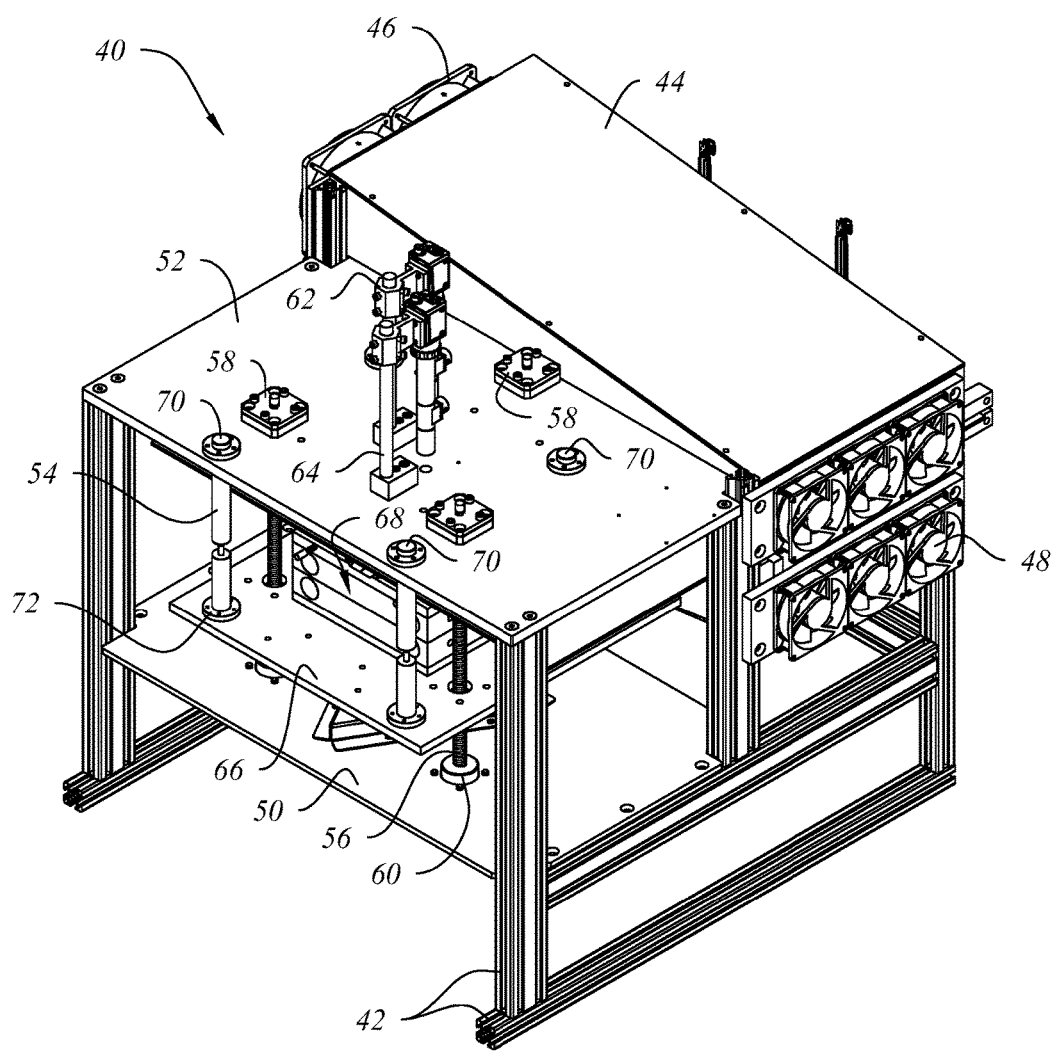
FIG. 2 is a top right perspective view of a wafer handling assembly, a plenum assembly and frame members supporting them inside the cabinet of FIG. 1, with the lower platen assembly disposed in an elevated position.
Figure 3:
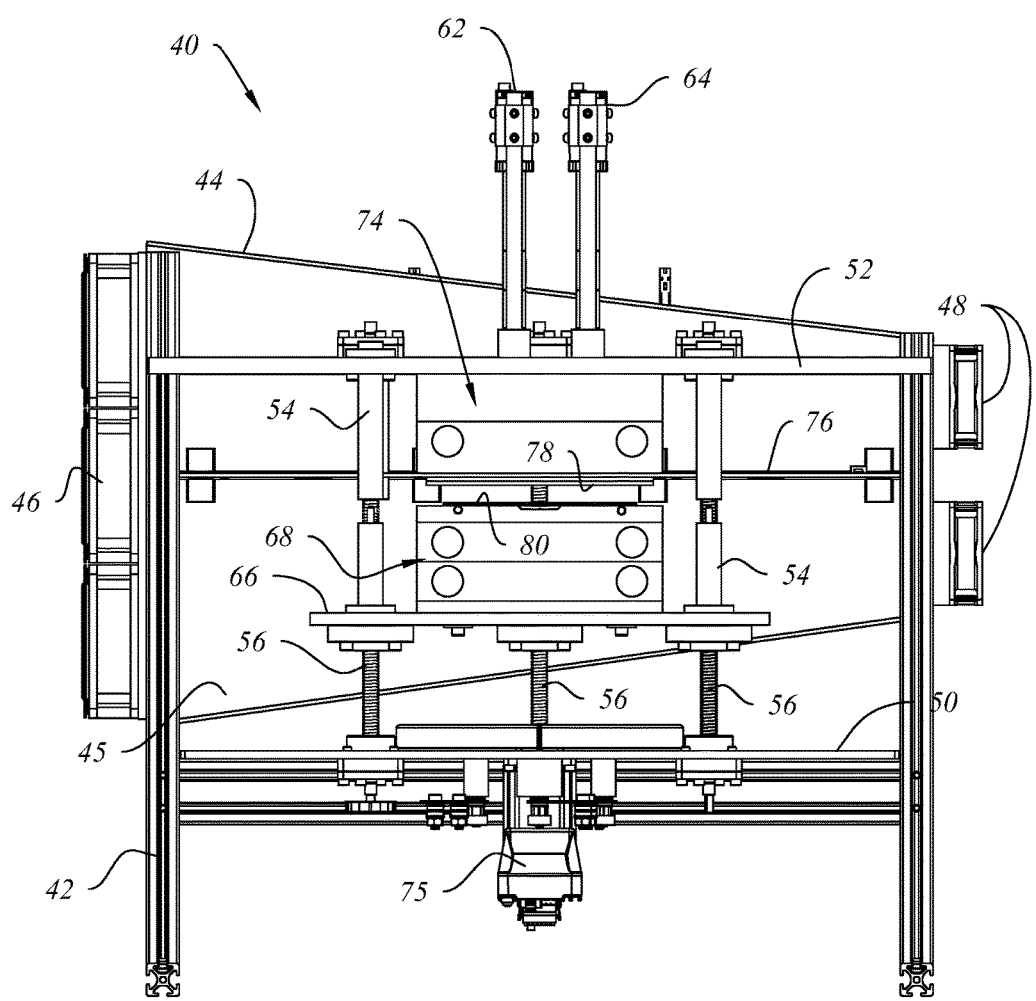
FIG. 3 is a front elevation view of the apparatus of FIG. 2.
Figure 4:
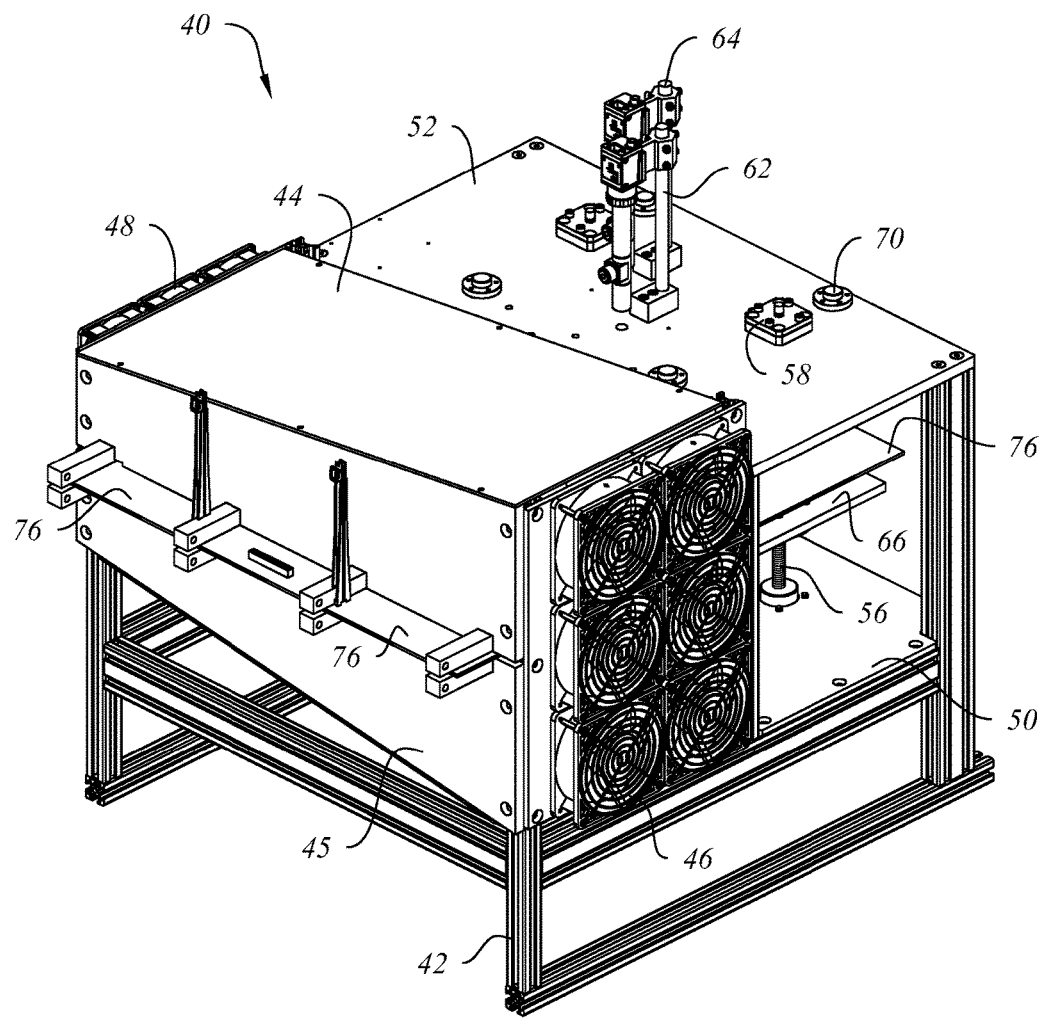
FIG. 4 is a top rear perspective view of the apparatus of FIG. 3.

As shown in FIGS. 2-4 (best seen in FIG. 3), lower platen assembly 68 and wafer 80 are raised by elevator drive assembly 75 and screw jacks 56 to a position where wafer 80 is disposed slightly below pin chuck 78, leaving a small open space between them. When elevator plate 66 is the position shown in FIGS. 2-4, fine positional adjustments of wafer 80 relative to pin chuck 78 are made using positioning assemblies 55 (visible in FIG. 5-6) and camera assemblies 62, 64. Camera assemblies 62, 64 can view the top surface of wafer 80 through corresponding apertures in upper plate 52 and upper platen assembly 74 (as discussed in greater detail below) to insure that fiducials on wafer 80 are correctly positioned to align the closely spaced individual pins projecting downwardly from pin chuck 78 with each individual die on wafer 80. Once the proper alignment and positioning are achieved, elevator plate 66 is moved upwardly to a point where the top surface of wafer 80 is compressed slightly against the pins projecting downwardly from pin chuck 78 to establish electrical connectivity between each pin and its respectively aligned die. Although stop members 54 are provided to prevent over travel of elevator plate 66, lower platen assembly 68 and wafer 80 in the upward direction relative to pin chuck 78, in actual practice electronic sensors (not shown) will desirably signal elevator drive assembly 75 to stop any upward movement of lower platen assembly 68 and wafer 80 before upward travel is limited by abutting contact between upper and lower stop members 54. It should also be appreciated that the drawing figures are not drawn to scale and that the vertical separation between pin chuck 78 and wafer 80 as depicted in in FIG. 3 is further reduced to insure electrical connectivity between the contact points of the pin chuck and die during the final positioning adjustments made to wafer 80.

Referring to FIGS. 5-7, wafer burn-in and testing unit 40 as previously described in relation to FIGS. 2-4 is depicted as previously described except that elevator plate 66 and lower platen assembly 68 are lowered relative to bottom plate 50 by screw jacks 56. When elevator plate 60 is in this position, wafer 80 is visible and readily accessible for insertion or removal through door 28 of housing 20 (FIG. 1). Referring to FIG. 7, other elements of elevator drive assembly 75 are visible beneath lower plate 50 and are shown for illustrative purposes without the drive belts, gears or other suitable means needed to interconnect screw jack drive wheels with output shaft of the drive motor to move elevator plate 66 upwardly and downwardly on screw jacks 56. Also visible in FIG. 7 is the downwardly facing surface of pin chuck 78 that is releasably attached to the underside of interposer assembly 76.

Referring to FIGS. 4, 6-7, interposer assembly 76 desirably extends transversely between lower platen assembly 68 and upper platen assembly 74, and between upper plenum assembly 44 and lower plenum assembly 45. As viewed in FIG. 4, the distal end of interposer assembly 76 extends transversely between and through upper plenum assembly 44 and lower plenum assembly 45 to define upper and lower plenum chambers. As viewed in FIG. 7, the proximal end of interposer assembly 76 is held in place between upper plenum assembly 44 and lower plenum assembly 45. Referring to FIGS. 6-7, the portion of interposer assembly 76 disposed between lower platen assembly 68 and upper platen assembly 74 comprises a plurality of orifices of varying sizes. Some orifices are provided to facilitate attachment of pin chuck 78 to the underside of interposer assembly 78 and some orifices are provided as viewing ports through which camera assemblies 62, 64 are focused to locate fiducials on the top surface of the wafer 80 (FIG. 6).

As seen in FIG. 6, three cards 90 are depicted in two spaced-apart rows as a simplified representation of the three full rows of six cards each (or 18 total cards that can be accommodated on the top side of interposer assembly 76 using four buses 88 as shown). Also, although not visible in FIG. 6, it should be appreciated that up to four additional buses accommodating up to another three full rows of cards 90 can be similarly positioned on, and releasably attached to, the underside of the distal end of interposer assembly 78. Each card 90 has 64 panels with 64 current amplifiers, meaning that electrical connectivity can be fanned out and established in one-to-one correspondence with each of more than 2000 die per wafer for simultaneous burn-in, testing and curing through use of the present invention. Because of the large number of current amplifiers operating simultaneously at the distal end of interposer assembly 78, heat is dissipated from the distal end of interposer assembly 78 by ambient air that is forced and drawn through both upper plenum assembly 44 and lower plenum assembly 45 by inlet fans 46 and outlet fans 48, respectively.

Figure 8:
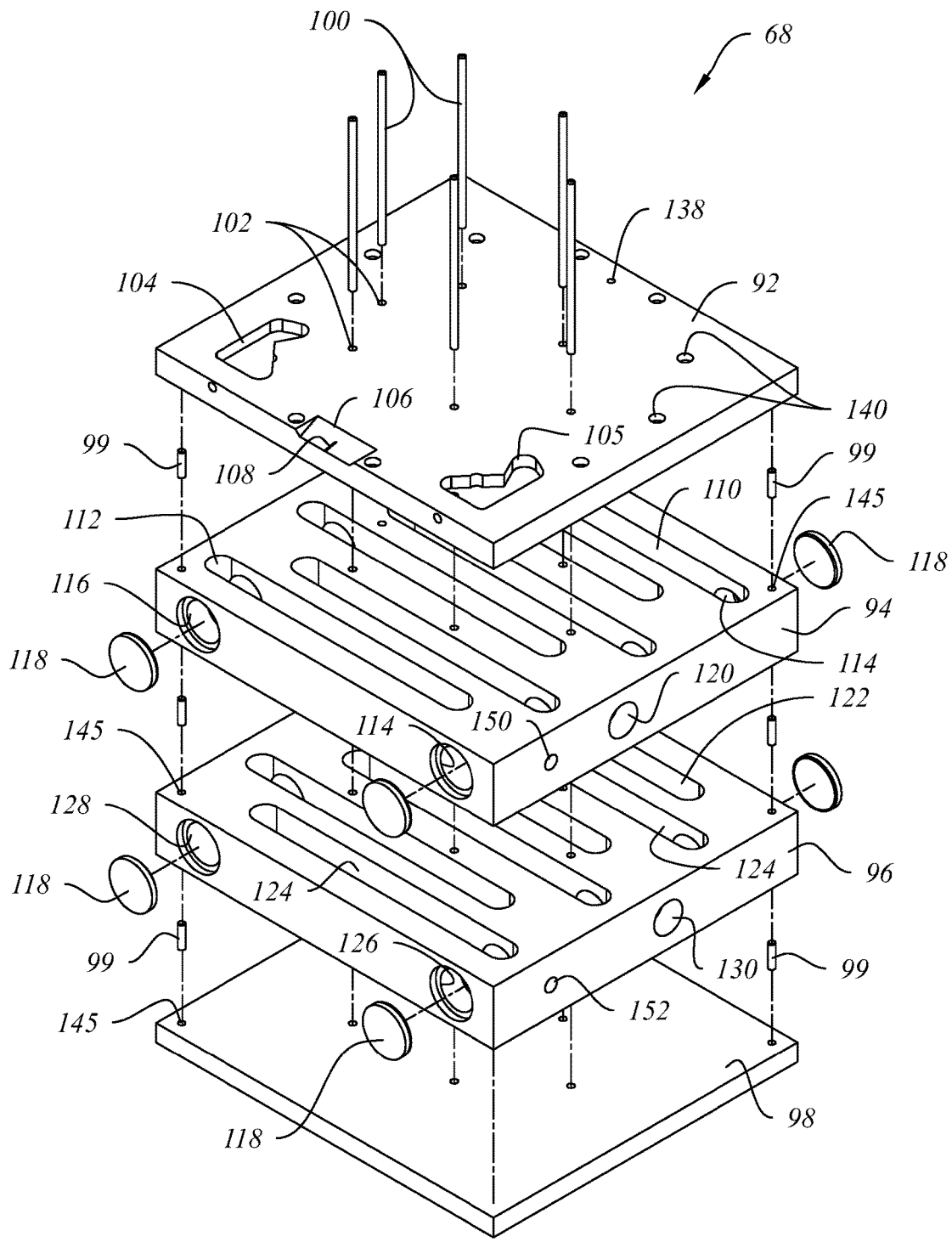
FIG. 8 is an exploded top perspective view of the lower platen assembly.
Figures 9, 12:
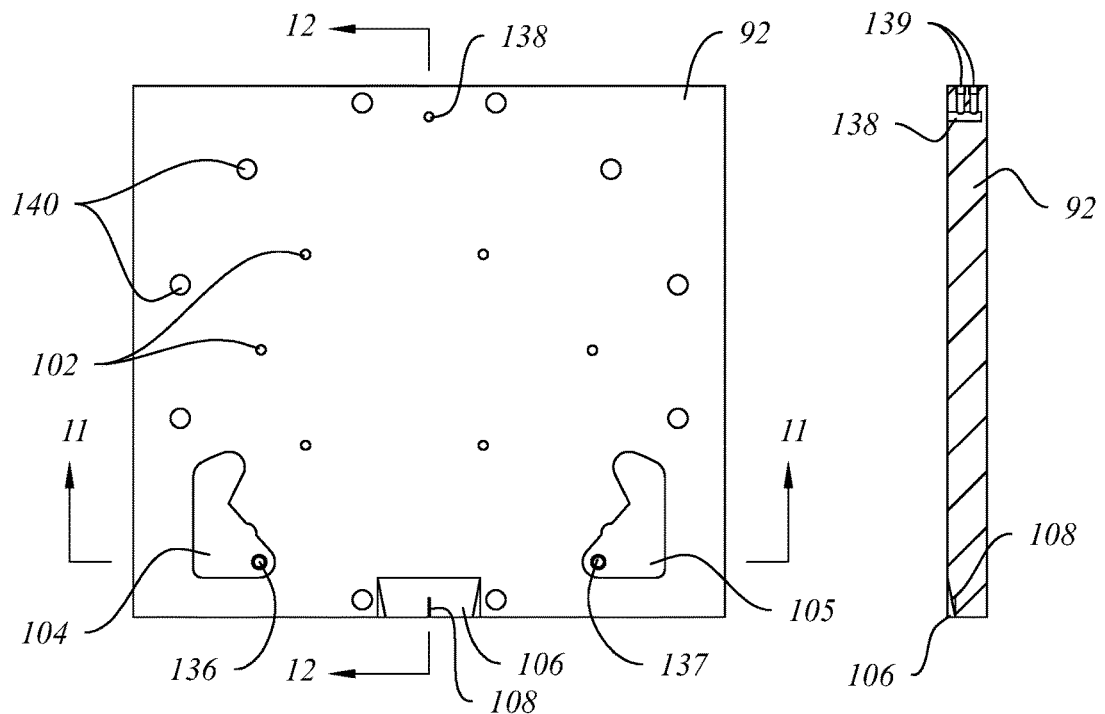
FIG. 9 is a top plan view of the top plate of the lower platen assembly of FIG. 6.
FIG. 12 is a cross-sectional view taken along line 12-12 of FIG. 9.
Figure 10:
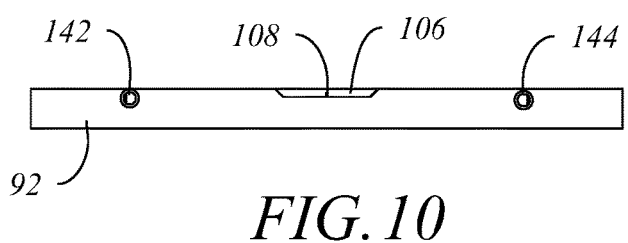
FIG. 10 is a front elevation view of the top plate of FIG. 9.
Figure 11:
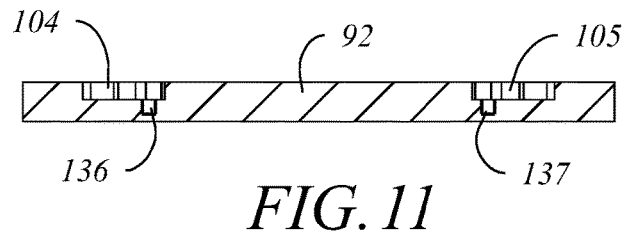
FIG. 11 is a cross-sectional view taken along line 11-11 of FIG. 9.
Figure 13:
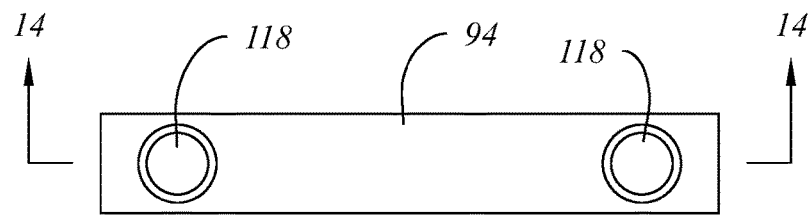
FIG. 13 is a front elevation view of the upper middle plate of FIG. 8.
Figure 14:
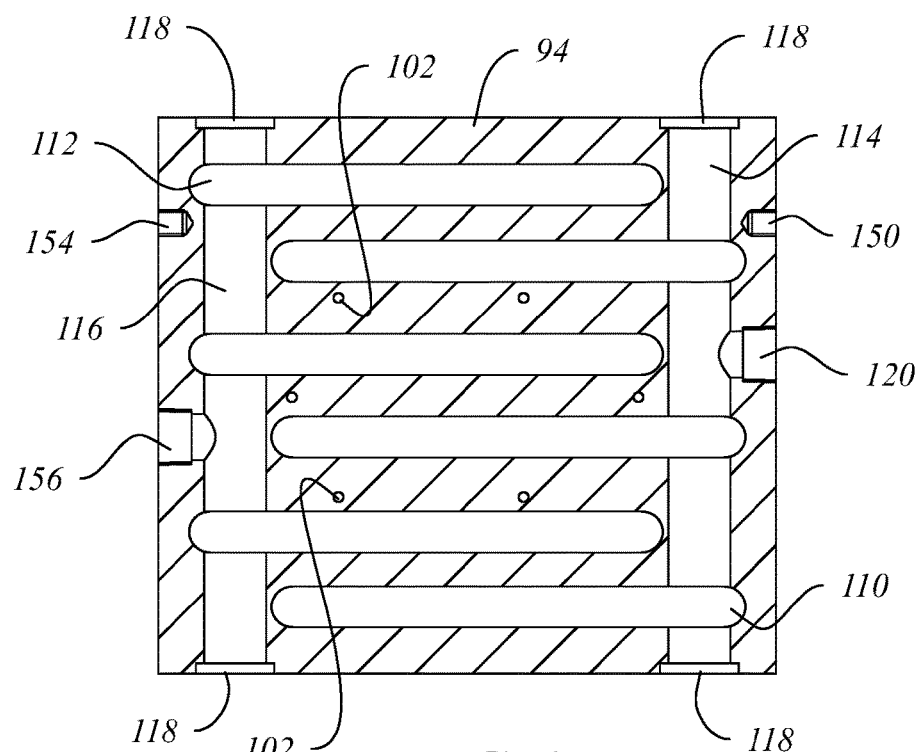
FIG. 14 is a cross-sectional view taken along line 14-14 of FIG. 13.
Figure 15:
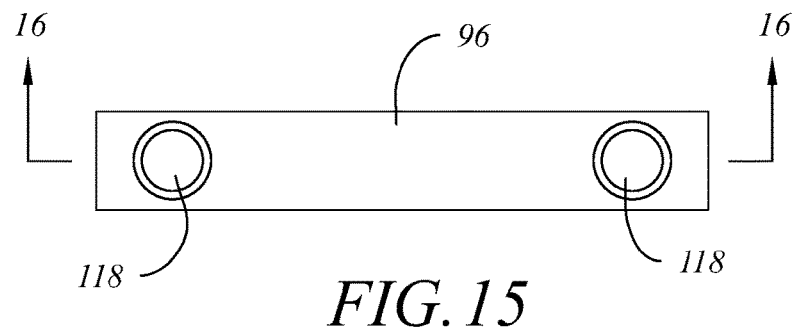
FIG. 15 is a front elevation view of the lower middle plate of FIG. 8.
Figure 16:
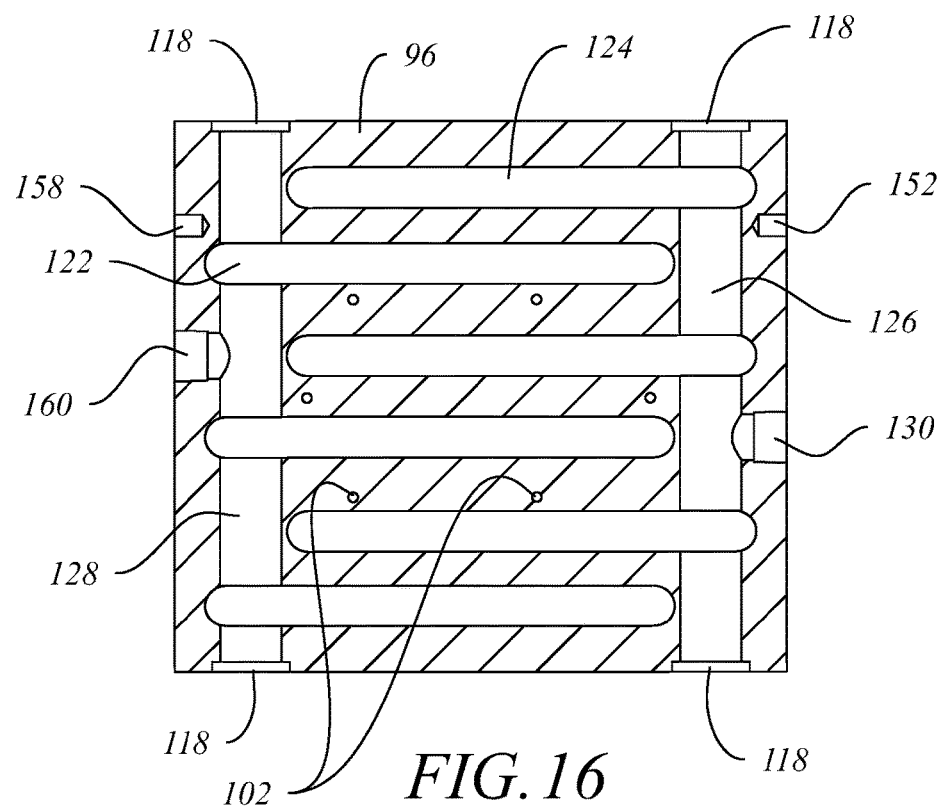
FIG. 16 is a cross-sectional view taken along line 16-16 of FIG. 15.

Referring to FIGS. 8-16, a satisfactory embodiment of lower platen assembly 68 further comprises a stack of four plates, preferably made of steel, including top plate 92, upper middle plate 94, lower middle plate 96 and bottom plate 98 (collectively, plates 92-98). As best seen in FIG. 8, plates 92-98, are desirably cooperatively alignable and releasably pinned together to form and stabilize the stack and to minimize relative movement between them as lower platen assembly 68 is elevated and lowered between successive burn-in and testing cycles. A plurality of relatively short pins 99 are releasably insertable into opposed bores 145 disposed inwardly of each of two diagonally opposed corners of each plate to thereby align and connect each pair of adjacent plates 92-96. Each of opposed bores 145 is preferably deep enough to receive slightly more than about one-half the length of the associated pin 99 to facilitate close contact between the plates with the pins inserted. A plurality of spaced-apart pins 100, longer than pins 99, preferably extends through coaxially aligned bores 102 to link plates 92-98 together in a unified stack. If desired, both the shorter and longer pins 99, 100 can have diameters sized to frictionally engage the corresponding bores 145, 102. As shown in FIGS. 8-9, the plurality of longer pins 100 and bores 102 are disposed in a generally hexagonal array although the number and placement of pins 100 and bores 102 can vary within the scope of the invention.

Referring to FIGS. 8-9, recesses 104, 105 are provided in the top side of top plate 92 to receive positioners that are adjustable to facilitate fine rotational (Theta) adjustment of a wafer supported by top plate 92. Referring to FIGS. 8-11, bores 136, 137 in the bottoms of recesses 104, 105, respectively, are desirably tapped for Helicoil® inserts or other similarly effective elements and communicate with forwardly facing bores 142, 144 (FIG. 10) that are similarly configured. Referring to FIGS. 8-10, 12, index marker 108 on ramp 108 is desirably provided to facilitate rotational alignment when placing a wafer 80 on top plate 92 of lower platen assembly 68 prior to making the fine adjustments.

Referring again to FIGS. 6, 8, upper middle plate 94 and lower middle plate 96 cooperate to facilitate the circulation of a liquid heat transfer medium through lower platen assembly 68. Prior to initiating burn-in and testing of a wafer, for example, it can be desirable to warm lower platen assembly 68 to a desired starting temperature so that lower platen assembly 68 does not serve as a heat sink and create a temperature gradient that cools the lower surface of the wafer being tested below a desired temperature. Such warming can be achieved by the use of an inline heater as is further described below in relation to FIG. 25, to warm the liquid heat transfer medium prior to circulating the medium through upper middle plate 94 and lower middle plate 96. Once burn-in and testing commence, however, heating is typically unnecessary and cooling of lower platen assembly 68 is often needed to maintain the average wafer temperature within a desired range. As noted above, ROA water or an aqueous glycol solution containing up to about 5% glycol are satisfactory for use as the liquid heat transfer medium of the invention.

Referring to FIGS. 8, 13-16, upper middle plate 94 and lower middle plate 62 are cooperatively configured to form a heat exchange manifold through which the liquid heat transfer medium can be circulated to control the temperature of lower platen assembly 68 as desired. According to one satisfactory embodiment of the invention, upper middle plate 94 and lower middle plate 96 each comprises a pair of parallel, axially spaced-apart cylindrical bores 114, 116 and 126, 128 that extend from front to back through the respective plates. The ends of bores 114, 116 and 126, 128 are desirably provided with end caps 118 that can maintain a liquid seal at pressures up to about 100 psig. Bores 114, 116 and 126, 128 each intersect and are disposed in fluid communication with a plurality of transversely extending slots milled into plates 94, 96. The slots in each of plates 94, 96 are desirably disposed in two alternating and laterally offset arrays. In upper middle plate 94, bore 114 communicates with transverse slots 110 and bore 116 communicates with transverse slots 112. The proximal and distal ends of each array of slots 110, 112 associated with each of bores 114, 116, respectively, are desirably aligned. In lower middle plate 96, bore 126 communicates with transverse slots 124 and bore 128 communicates with transverse slots 122. The proximal and distal ends of each array of slots 124, 122 associated with each of bores 126, 128, respectively, are desirably aligned. The liquid heat transfer medium is desirably circulated through each of plates 94, 96, entering through inlet ports 120, 130 and exiting through outlet ports 156, 160, respectively. Thermowell receptacles 150, 152 and 154, 158 are desirably provided for use in determining the temperatures on the inlet and outlet sides of each of plates 94, 96, respectively. The generally hexagonal array of laterally spaced-apart bores 102 is desirably provided in each of plates 94, 96 for the insertion of elongate pins 100 as previously discussed in relation to FIG. 8 to hold the stack of plates 92, 94, 96, 98 together in a preferred alignment.

Referring to FIGS. 17-23, upper platen assembly 74 comprises top plate 162 and bottom plate 164 that are preferably made of metal, preferably copper because of its high thermal conductivity, which are cooperatively configured to form a heat exchange manifold through which the liquid heat transfer medium can be circulated to control the temperature of upper platen assembly 74 as desired. According to one satisfactory embodiment of the invention, bottom plate 164 of upper platen assembly 74 comprises a pair of parallel, axially spaced-apart cylindrical bores 166, 168 that extend from front to back through plate. The ends of bores 166, 168 are desirably provided with end caps 118 that can maintain a liquid seal at pressures up to about 100 psig. Bores 166, 168 each intersect and are disposed in in fluid communication with a plurality of transversely extending slots 172 milled into bottom plate 164. Inlet and outlet ports 170, 174 are disposed in fluid communication with bores 166, 168, respectively, for use in circulating a liquid heat transfer medium. Pins 99 insertable into bores 145 are desirably provided for use in aligning and connecting plates 162, 164, and for aligning the underside of bottom plate 164 with interposer 76 and pin chuck assembly 78 (FIG. 7). Referring to FIGS. 17-18, 20-22, tapered bores 86 through top and bottom plates 162, 164 are desirably provided for use by camera assemblies 62, 64 (FIG. 7) in viewing fiducials disposed on wafer 80 (FIG. 5) undergoing testing through plates 162, 164.

Figure 24:
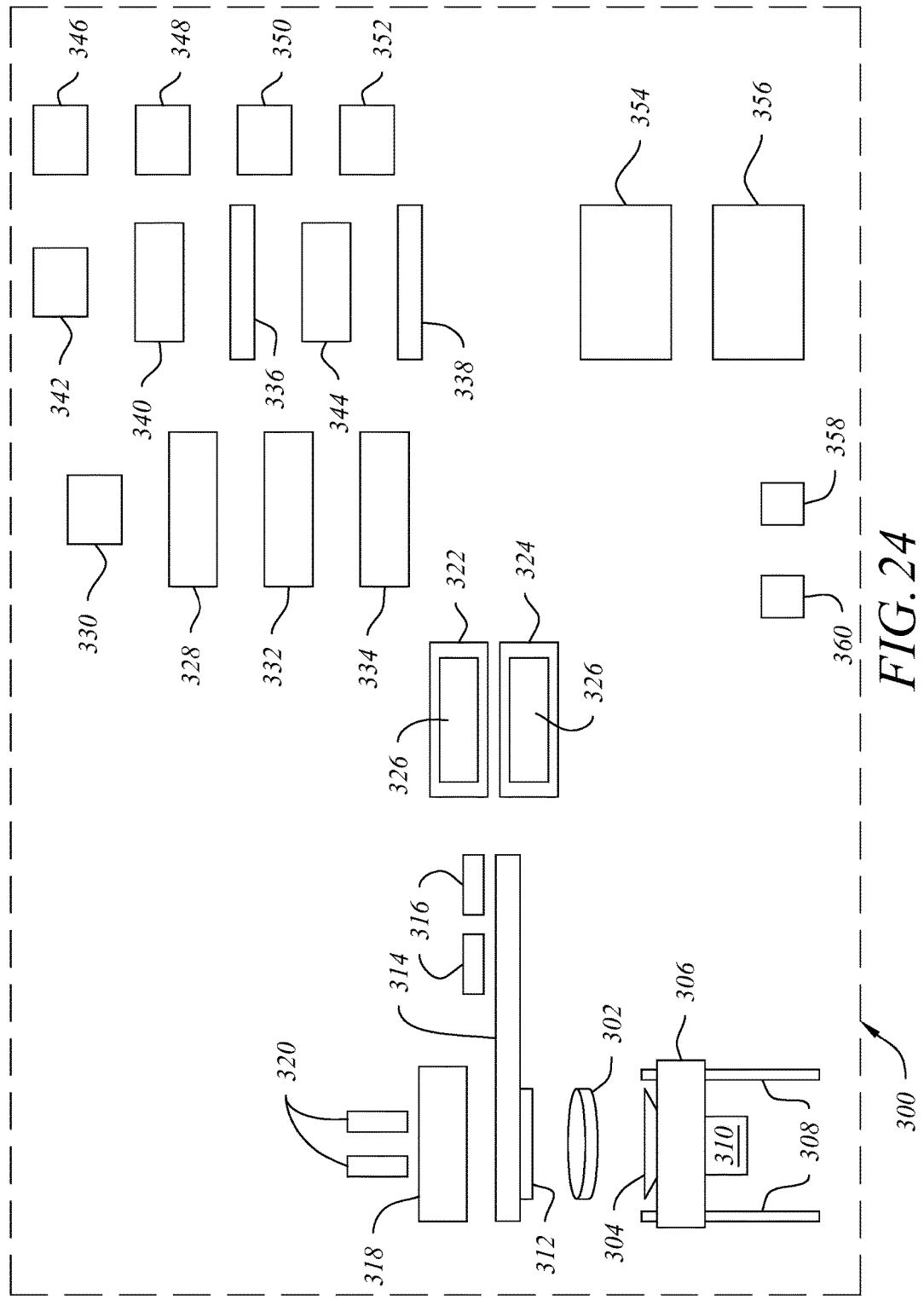
FIG. 24 is a simplified diagrammatic view of one embodiment of a system of the invention.

Referring to FIG. 24, which is a simplified diagrammatic representation of a semiconductor wafer level burn-in and testing system 300 of the invention, semiconductor wafer 302 is disposed between wafer support pad 304 and pin chuck assembly 312. Pin chuck assembly 312 is supported by and beneath interposer assembly 314 which also supports on the opposite end a plurality of cards 316 having sufficient current amplifiers to enable the current amplifiers to be electronically connected in one-to-one correspondence to each individual die (not shown) on uncut wafer 302. Upper and lower platen assemblies 318, 306, are positioned above and below wafer 302 and pin chuck assembly 312, respectively, to control the top and bottom surface temperatures and the mean temperature of wafer 302 within desired ranges during burn-in, testing and/or curing of wafer 302. Lower platen assembly can desirably be raised by screw jacks 308 controlled by drive assembly 310 to raise lower platen assembly 306, wafer support pad 304 and wafer 302 to a desired level relative to pin chuck assembly 312. Camera assemblies 320 mounted above upper platen assembly 318 have viewing fields that enable them to focus on fiducial markers on wafer 302 to properly align contact points disposed on the underside of pin chuck assembly 312 with each individual die of wafer 302. Although shown to the side of interposer assembly 314 for ease of illustration, upper and lower plenum assemblies 322, 324 are desirably provided above and below the end of interposer assembly 314 where cards 316 are mounted to help dissipate excess heat that is generated when the current amplifiers disposed on the cards are energized during burn-in, testing and curing. Fans 326 associated with each of plenum assemblies 322, 324 desirably force ambient air, or chilled air if needed, both above and below interposer assembly 314 to facilitate the cooling. Each of the component parts of system 300 as mentioned above can be configured or grouped within a single "burn-in bay," and it will be appreciated by those of skill in the art upon reading this disclosure that system 300 can likewise be configured to support and control a plurality of burn-in bays for use in burning in, testing and curing a plurality of semiconductor wafers simultaneously if desired.

Still referring to FIG. 24, central processing unit (CPU) 328 and monitor 330 are desirably provided for use in programming and establishing parametric limits for wafer burn-in and testing programs for use in one or more burn-in bays each further comprising a wafer burn-in and testing unit 40 as described above in relation to FIGS. 1-7. CPU 328 is desirably provided with a power supply 340 and is configured to run standard database/spreadsheet software such as Microsoft Excel® and auxiliary applications software such as XML Interface App 346 and an LUT Management App 348. CPU 328 is satisfactorily connected by switch 336 to service controller 332, which is desirably housed together with a wafer burn-in and testing unit 40 in a designated burn-in bay.

Service controller 332 desirably has its own touch monitor 342 and is configured to run recipe-based programming including, for example, an alignment app 350 that properly positions semiconductor wafer 302 that is undergoing testing in relation to the pin chuck 312 and interposer 314, and a control app 352 that initiates burn-in and testing, and that monitors, displays and relays all test data to digital storage according to a defined protocol. Control app 352 is also desirably used to set or change parametric limits (e.g. test period, data monitoring and recordation intervals, minimum and maximum wafer temperature, voltage, current, etc.), to interactively display real-time and cumulative test data, to shut down testing of any die for which those limits are reached or exceeded during testing, and to report the test data as directed. As another example, according to one embodiment of the invention, control app 352 can be programmed so that touch monitor 342 displays a color indicator to quickly alert an operator to the performance of a wafer or die, such as green if both voltage and current are well within the parametric limits, light blue if one or both is a little low, dark blue if very low, pink if a little high, red if very high, and brown if the parametric limits have been exceeded and testing is being shut down for a particular die.

Service controller 332 desirably has its own power supply 344 and a switch 338 providing electrical connectivity to camera assemblies 320 and to driver controller 334 that operates drive assembly 310 during insertion, positioning or removal of wafer 302. Switch 338 also links service controller 332 to other auxiliary components of system 300 such as pump 358, heater 360, chiller 354 and exchanger 356 for use in regulating the temperature and flow rate of heat transfer liquids that are used to control the temperature of upper and lower platen assemblies 318, 306, respectively.

Figure 25:
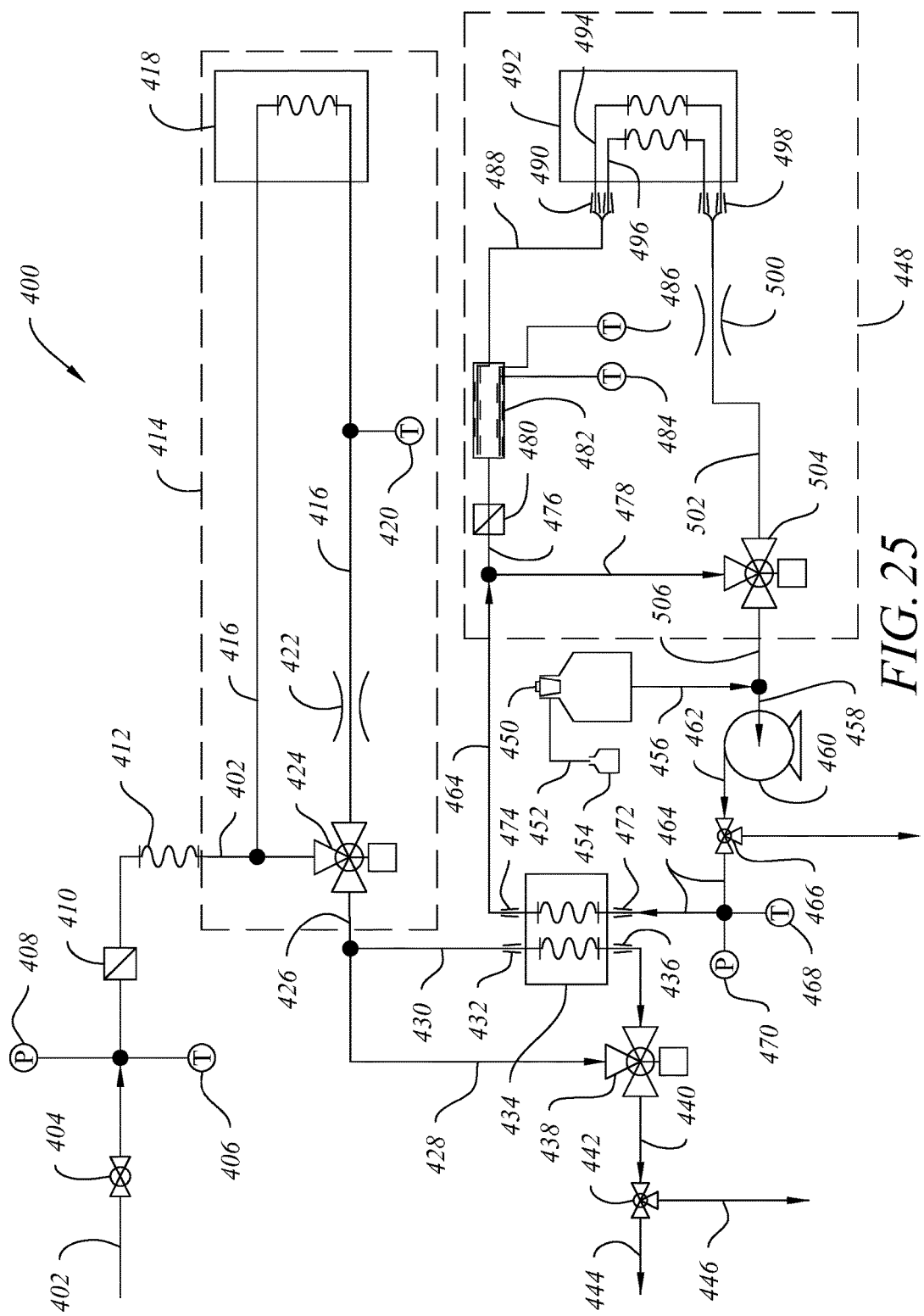
FIG. 25 is simplified diagrammatic view of one embodiment of a temperature control system and apparatus suitable for use as part of the system, apparatus and method of the invention.

FIG. 25 discloses another embodiment of a temperature control system 400 that is satisfactory for use in maintaining the top and bottom temperatures of an uncut semiconductor wafer within desired limits during wafer burn-in and testing. System. 400 desirably comprises two independent fluid flowpaths. The first circulates a first liquid heat transfer medium through upper flow section 414 containing upper platen assembly 418, and the second circulates a second temperature-controlled liquid heat transfer medium through lower flow section 448 including lower platen assembly 492. The first heat transfer medium is preferably filtered factory water and the second heat transfer medium is preferably either water purified through reverse osmosis (RO water) or an aqueous glycol solution as previous mentioned. It should be understood, however, other similarly effective liquid heat transfer media can also be used in the present invention if desired.

Still referring to FIG. 25, filtered factory water desirably enters temperature control system 400 through line 402 and shut-off valve 404, and passes by inlet temperature and pressure sensors 406, 408, respectively, and through filter 410 into a fluid/air heat exchanger 412. Upon exiting liquid/air heat exchanger 412, the liquid flow is controlled by upper mixing valve 424 to direct all or a portion of the flow from line 402 through line 416 and upper platen assembly 418. After exiting upper platen assembly 418 and passing through flow restrictor 422, the water flowing through line 416 is recombined in line 426 with any water flow bypassing line 416 through mixing valve 424. Another temperature sensor 420 is desirably provided between upper platen assembly 418 and flow restrictor 422 disposed upstream of mixing valve 424.

Mixing valve 438 is desirably used to selectively control the flow of filtered factory water exiting upper mixing valve 424 through line 426 into flow lines 428 and 430, respectively. If needed, all or a portion of the flow can be directed through flow line 430, flow transition zone 432, liquid/liquid heat exchanger 434 and flow transition zone 436 to cool the second liquid heat transfer medium that is circulated through lower flow section 448 to selectively heat or cool lower platen assembly 492 as discussed below. If no cooling of the second liquid heat transfer medium is needed, mixing valve 438 can be reconfigured to direct all flow from line 426 through line 428 and into line 440 exiting mixing valve 438. The flow of filtered factory water exiting mixing valve 438 through line 440 can be selectively shut off, returned to inlet line 402 or diverted to drain through line 446 by shut-off valve 442 as desired.

Still referring to FIG. 25, the second liquid heat transfer fluid desirably flows in a closed loop fluid circulation system that passes through liquid/liquid heat exchanger 434 in a direction countercurrent to the flow of filtered factory water as described above. A supply of the second liquid heat transfer medium is desirably stored in a reservoir such as tank 450 for use as needed. Tank 450 is connected by flow line 456, 458 to the suction side of circulation pump 460 and discharges liquid through line 462 when pump 460 is activated. Overflow tank 454 desirably communicates with tank 450 through line 452. While circulating liquid through lower plenum assembly 492, valve 466 is desirably positioned to direct liquid discharged by pump 460 through line 464 past temperature and pressure sensors 468, 470, respectively, and through flow transition zone 472, liquid/liquid heat exchanger 434 and flow transition zone 474. The flow transition zones are desirably provided to improve heat transfer while the liquids are passing through heat exchanger 434.

After exiting liquid/liquid heat exchanger 434 through line 464, the liquid flow can be controlled by mixing valve 504 to split the flow into a primary stream through line 476 and a bypass stream through line 478. The primary stream desirably passes through filter 480 and through an inline heater 482 that may or may not be activated, depending upon the stage of operations. As previously mentioned, during startup of the subject wafer curing and testing system, it may be desirable to heat lower plenum assembly 492 initially to offset the heat sink of the lower platen assembly 492 to achieve a desired minimum temperature parameter for the lower surface of the wafer. During such period, inline heater 482 can be activated and controlled in accordance with inputs received from temperature sensors 484, 486. Once lower platen assembly 492 has warmed sufficiently to maintain a desired minimum wafer bottom surface temperature during the initial phase of curing and testing the wafer, inline heater 482 can be turned off and the liquid heat transfer medium flowing through lower platen assembly 492 can be chilled to remove excess heat from lower platen assembly 492.

Within lower platen assembly 492 the liquid flow is further subdivided by fluid splitter 490 into two streams 494, 496 for circulation through the upper and lower plates of lower platen assembly 492. Upon exiting lower platen assembly 492, liquid streams 494, 496 are desirably recombined in transition zone 498 and flow restrictor 500 before being recombined with any portion of the bypass stream entering lower mixing valve 504 through line 478 as those recombined flows are discharged from lower mixing valve 504 into pump suction line 458. When recirculation is no longer desired, the liquid heat exchange medium being recirculated by pump 460 can be pumped to drain by repositioning valve 466.

Although not described in detail herein, a plurality of temperature and pressure sensors, thermocouples and electronic controllers are desirably utilized in combination with the mixing valves to control the temperatures and flow rates of the heat transfer fluids in relation to temperature set points that are consistent with achieving the parametric limits during curing and testing of the wafers.

Other alterations and modifications of the invention will likewise become apparent to those of ordinary skill in the art upon reading this specification in view of the accompanying drawings, and it is intended that the scope of the invention disclosed herein be limited only by the broadest interpretation of the appended claims to which the inventor(s) and/or Applicant are legally entitled.

What is claimed is:

1. A system for simultaneously energizing, burning in and testing electronic circuitry embodied on each individual die of an uncut semiconductor wafer having top and bottom surfaces, the system comprising:
a housing;
an upper platen assembly and a lower platen assembly disposed inside the housing;
a plenum assembly;
an interposer assembly comprising a first portion disposed between the upper platen assembly and the lower platen assembly, and a second portion disposed inside the plenum assembly;
a pin chuck supported beneath the first portion of the interposer assembly;
a wafer support structure configured to receive, support and selectively position the uncut semiconductor wafer relative to the pin chuck;
at least one electronic camera system configured to monitor alignment of the pin chuck relative to the uncut semiconductor wafer, the at least one electronic camera system further comprising two electronic cameras each having teleconcentric lenses; and
a programmable CPU and service controller configurable to selectively energize the system and set, monitor, test, change, display and store a plurality of performance parameters for the electronic circuitry of each of the plurality of die of the uncut semiconductor wafer during a desired burn-in and test period;
wherein each of the upper platen assembly and the lower platen assembly further comprises a flow section configured to receive and discharge a temperature-controlled, circulated liquid heat transfer medium to maintain the temperatures of the top and bottom surfaces of the uncut semiconductor wafer within desired limits during wafer burn-in and testing; and
wherein the wafer support structure, pin chuck, interposer assembly and electronic control network are cooperatively configured and controllable to position the uncut semiconductor wafer relative to the pin chuck and establish electrical connectivity between the electronic circuitry of each die on the uncut semiconductor wafer and the pin chuck, and between the pin chuck and the service controller.

2. The system of claim 1 further comprising apertures through the pin chuck that provide views of fiducial markers on the uncut semiconductor wafer for the electronic cameras.

3. A system for simultaneously energizing, burning in and testing electronic circuitry embodied on each individual die of an uncut semiconductor wafer having top and bottom surfaces, the system comprising:
a housing comprising a frame, at least one ventilated panel, and a door through which the uncut semiconductor wafer is selectively insertable onto and removable from the wafer support structure;
an upper platen assembly and a lower platen assembly disposed inside the housing;
a plenum assembly;
an interposer assembly comprising a first portion disposed between the upper platen assembly and the lower platen assembly, and a second portion disposed inside the plenum assembly;
a pin chuck supported beneath the first portion of the interposer assembly;
a wafer support structure configured to receive, support and selectively position the uncut semiconductor wafer relative to the pin chuck; and
a programmable CPU and service controller configurable to selectively energize the system and set, monitor, test, change, display and store a plurality of performance parameters for the electronic circuitry of each of the plurality of die of the uncut semiconductor wafer during a desired burn-in and test period;
wherein each of the upper platen assembly and the lower platen assembly further comprises a flow section configured to receive and discharge a temperature-controlled, circulated liquid heat transfer medium to maintain the temperatures of the top and bottom surfaces of the uncut semiconductor wafer within desired limits during wafer burn-in and testing; and
wherein the wafer support structure, pin chuck, interposer assembly and electronic control network are cooperatively configured and controllable to position the uncut semiconductor wafer relative to the pin chuck and establish electrical connectivity between the electronic circuitry of each die on the uncut semiconductor wafer and the pin chuck, and between the pin chuck and the service controller.

4. A system for simultaneously energizing, burning in and testing electronic circuitry embodied on each individual die of an uncut semiconductor wafer having top and bottom surfaces, the system comprising:
a housing;
an upper platen assembly and a lower platen assembly disposed inside the housing;
a plenum assembly;
an interposer assembly comprising a first portion disposed between the upper platen assembly and the lower platen assembly, and a second portion disposed inside the plenum assembly;
a pin chuck supported beneath the first portion of the interposer assembly;
a wafer support structure configured to receive, support and selectively position the uncut semiconductor wafer relative to the pin chuck; and
a programmable CPU and service controller configurable to selectively energize the system and set, monitor, test, change, display and store a plurality of performance parameters for the electronic circuitry of each of the plurality of die of the uncut semiconductor wafer during a desired burn-in and test period;
wherein each of the upper platen assembly and the lower platen assembly further comprises a flow section configured to receive and discharge a temperature-controlled, circulated liquid heat transfer medium to maintain the temperatures of the top and bottom surfaces of the uncut semiconductor wafer within desired limits during wafer burn-in and testing and an internal independent liquid temperature-controlled loop with a pump, heat exchanger, filter and in-line heater for use in controlling the temperature of the temperature-controlled liquid heat transfer medium; and
wherein the wafer support structure, pin chuck, interposer assembly and electronic control network are cooperatively configured and controllable to position the uncut semiconductor wafer relative to the pin chuck and establish electrical connectivity between the electronic circuitry of each die on the uncut semiconductor wafer and the pin chuck, and between the pin chuck and the service controller.

5. The system of claim 4 further comprising an external chiller for use in controlling the temperature of the temperature-controlled liquid heat transfer medium within the internal loop.

* * * * *

UNITED STATES PATENT AND TRADEMARK OFFICE
CERTIFICATE OF CORRECTION

PATENT NO. : 10,267,845 B2  
APPLICATION NO. : 15/593601  
DATED : April 23, 2019  
INVENTOR(S) : Storey et al.

Page 1 of 1

It is certified that error appears in the above-identified patent and that said Letters Patent is hereby corrected as shown below:

On the Title Page

At Item (72), Inventors: At Line 8 after (US) insert:  
--Landon Reid Elfenbein, Richardson, TX (US); and  
Joseph Koenig, Richardson, TX (US)--

Signed and Sealed this  
Twenty-second Day of October, 2019

Andrei Iancu  
*Director of the United States Patent and Trademark Office*